United States Patent
Hoshizawa et al.

(10) Patent No.: US 7,747,910 B2
(45) Date of Patent: Jun. 29, 2010

(54) METHOD OF RECORDING/REPRODUCING DIGITAL DATA AND APPARATUS FOR SAME

(75) Inventors: Taku Hoshizawa, Yokohama (JP); Shigeki Taira, Kawasaki (JP); Osamu Kawamae, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/180,450

(22) Filed: Jul. 25, 2008

(65) Prior Publication Data

US 2008/0294947 A1  Nov. 27, 2008

Related U.S. Application Data

(63) Continuation of application No. 11/931,964, filed on Oct. 31, 2007, now Pat. No. 7,421,626, which is a continuation of application No. 11/025,489, filed on Dec. 28, 2004, now Pat. No. 7,305,606, which is a continuation of application No. 09/931,996, filed on Aug. 17, 2001, now abandoned.

(30) Foreign Application Priority Data

| Dec. 1, 2000 | (JP) | ............................. 2000-371486 |
| Dec. 11, 2000 | (JP) | ............................. 2000-381652 |

(51) Int. Cl.
G06F 11/00 (2006.01)
(52) U.S. Cl. .................. 714/701; 714/755; 714/756; 714/763; 714/762; 714/788; 714/786; 369/59.25
(58) Field of Classification Search ................ 714/701, 714/756, 761–763, 769, 787, 788; 369/59.25
See application file for complete search history.

(56) References Cited

U.S. PATENT DOCUMENTS

| 4,394,642 A | 7/1983 | Currie et al. |
| 5,230,003 A | 7/1993 | Dent et al. |
| 5,729,647 A * | 3/1998 | Kim .............................. 386/46 |

(Continued)

FOREIGN PATENT DOCUMENTS

JP  03-266264  11/1991

(Continued)

OTHER PUBLICATIONS

U.S. Appl. No. 12/180,425 Office Action mailed on Apr. 28, 2010.

(Continued)

*Primary Examiner*—Guy J Lamarre
(74) *Attorney, Agent, or Firm*—Townsend and Townsend and Crew LLP

(57) ABSTRACT

A digital data recording/reproducing method includes the steps of: interleaving data on a PI code for each PI code of a 208-row ECC block; and converting a short burst error into random errors by dispersing errors on the PI codes. Moreover, the digital data recording/reproducing method increases correction capability against several bytes to several tens bytes of errors generated at random without changing burst error correction length by performing this processing for respective PI codes by using interleave rules that are different as much as possible from one another.

2 Claims, 17 Drawing Sheets

U.S. PATENT DOCUMENTS

| | | | |
|---|---|---|---|
| 6,072,759 A * | 6/2000 | Maeda et al. | 369/59.25 |
| 6,112,324 A * | 8/2000 | Howe et al. | 714/763 |
| 6,175,686 B1 * | 1/2001 | Noda | 386/123 |
| 6,311,305 B1 | 10/2001 | Sollish et al. | |
| 6,553,516 B1 | 4/2003 | Suda et al. | |
| 7,421,626 B2 * | 9/2008 | Hoshizawa et al. | 714/701 |
| 2002/0157057 A1 | 10/2002 | Hwang et al. | |
| 2005/0108612 A1 * | 5/2005 | Downing | 714/758 |

FOREIGN PATENT DOCUMENTS

| | | |
|---|---|---|
| JP | 08-125548 | 5/1996 |
| JP | 09-54956 | 2/1997 |
| JP | 09-293331 | 11/1997 |

OTHER PUBLICATIONS

U.S. Appl. No. 12/180,435 Office Action mailed on Apr. 13, 2010.
U.S. Appl. No. 12/180,442 Office Action mailed on Apr. 2, 2010.

* cited by examiner

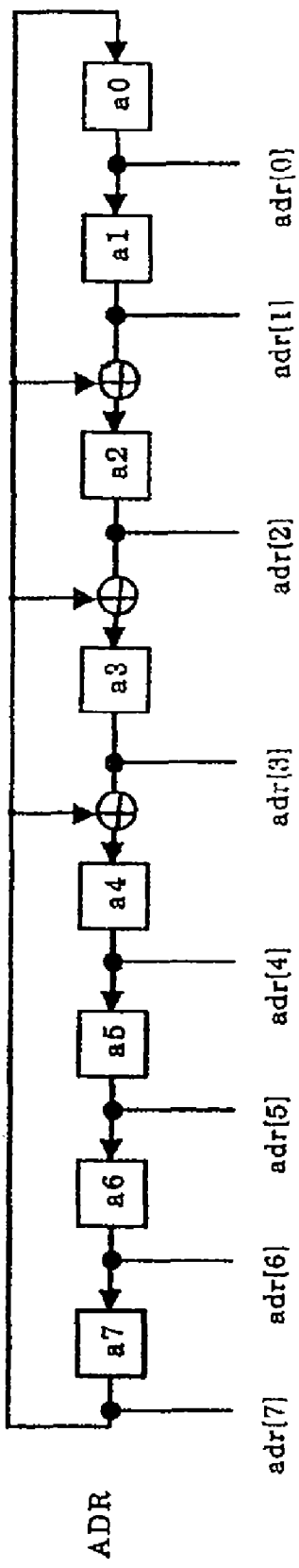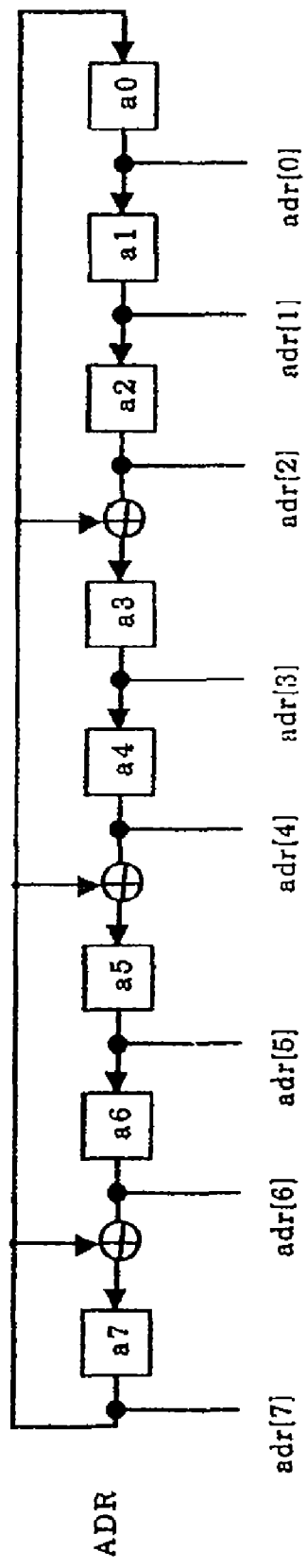

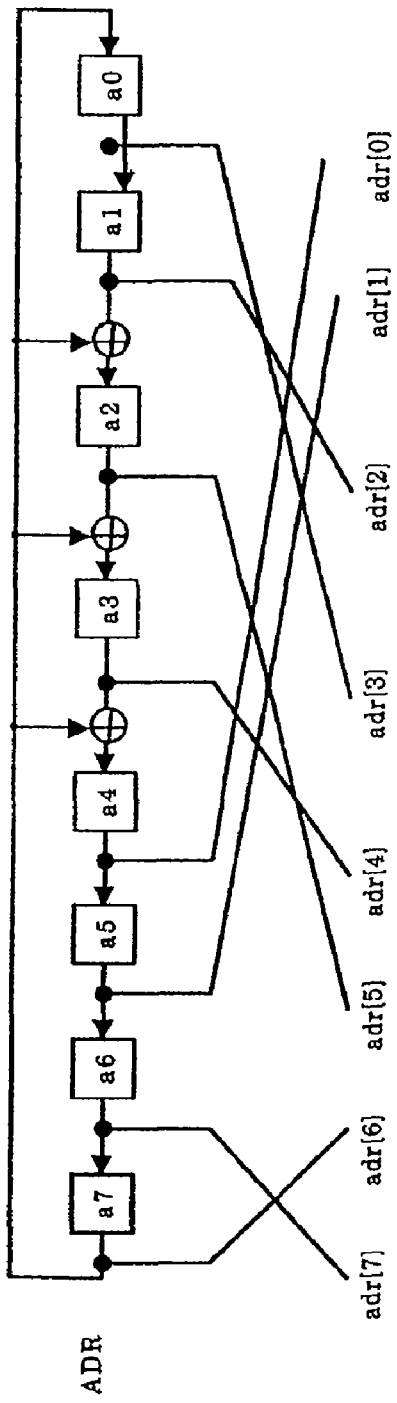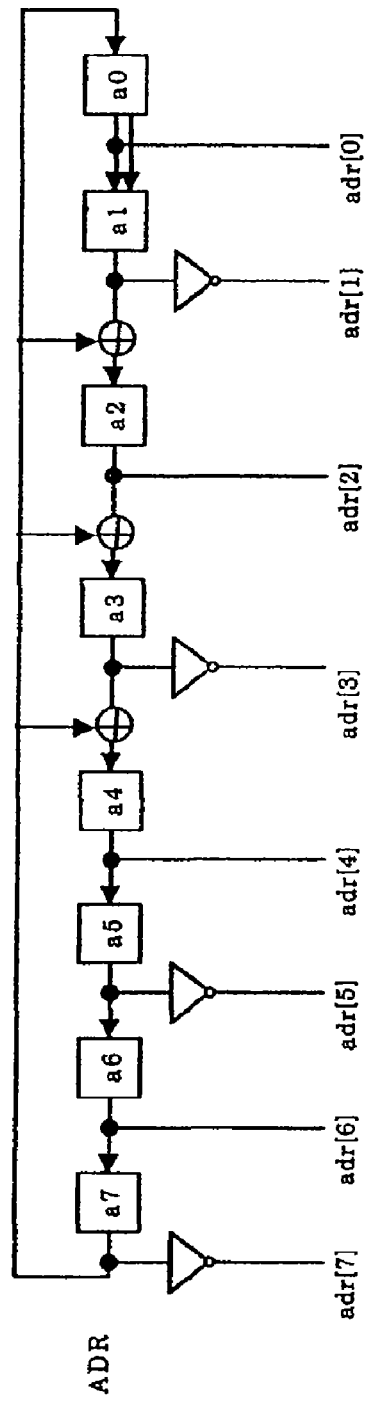

METHOD OF RECORDING/REPRODUCING DIGITAL DATA AND APPARATUS FOR SAME

CROSS-REFERENCES TO RELATED APPLICATIONS

This application is a continuation of U.S. application Ser. No. 11/931,964, filed Oct. 31, 2007 (now U.S. Pat. No. 7,421,626), which is a continuation of U.S. application Ser. No. 11/025,489 (now U.S. Pat. No. 7,305,606), filed Dec. 28, 2004, which is a continuation of U.S. application Ser. No. 09/931,996 (now abandoned), filed Aug. 17, 2001, which claims priority from Japanese Application No. 2000-371486, filed Dec. 1, 2000 and Japanese Application No. 2000-381652, filed Dec. 11, 2000, all of which are herein incorporated by reference for all purposes.

BACKGROUND OF THE INVENTION

The present invention relates to an error correction technology to remove an error, in particular, to a digital data reproducing method, a digital data recording method, and apparatus using error correction by product code. In particular, the present invention relates to a data recording and reproducing method, and an apparatus for performing interleave in byte unit to the data consisting of multiple lines.

Although the present invention is widely applicable to digital data reproducing systems and recording systems that perform error correction by product code, it will be described here by citing a DVD data reproducing system and a data recording system as examples.

A DVD (digital versatile disc) is a medium which has about 7 times the capacity of a CD (compact disc). As a medium that records data on a DVD, there are DVD-RAM, DVD-R, and DVD-RW. Recordable media are becoming increasingly more popular, as seen in the recent growth of CD-R.

A format of DVD-RAM will be described below. In a present DVD, interleave is performed per row to the data consisting of multiple lines.

First, an overview of demodulation processing of recorded data on DVD-RAM will be shown by using FIG. 3. The main data 310 that has been recorded is divided into blocks of 2048 bytes. As shown in FIG. 4, each block includes 4 bytes of identification data (ID) 401, 2 bytes of IED (ID Error Detection Code) 402 that is an ID error detecting code parity, and 6 bytes of RSV (reservation bytes) 403 that is a reservation area, in addition to the main data (2048 bytes) for a data stream of 2060 bytes. Furthermore, 4 bytes of error detecting code parity (EDC) 404 is added to the end of a data stream of 2060 bytes. The resulting 2064 bytes constitute data unit 1 (before scramble) 304 and is organized into twelve rows of 172 bytes per row as shown in FIG. 4. Next, according to a scramble rule determined with the value of the ID part of the data unit 1, scramble processing is performed on the 2048 bytes of the main data part 310 to produce a data unit 1 (after scramble) 305. Sixteen instances of these data units (after scramble) 1 are combined to form a data field comprising 192 rows×172 columns bytes, e.g., (see data field 306 in FIG. 5. Next, 16 rows of Parity of Outer-code (PO) data are added (step 306) to the 192-row data field to produce a 208-row×172 column data field. Next, ten bytes of Parity of Inner-code (PI) is added (step 307) to each of the 208 rows, extending each row to 182 bytes, to form one ECC block. Then, a PO interleave operation to interleave the sixteen rows of PO data (182 bytes wide) with the original 192-row data field. More specifically, a PO row is added at the end of each instance of data unit 1 (i.e., twelve rows) in the 192-row data field to form sixteen 13-row data units 2 (step 308). After an 8/16 modulation operation is performed to convert the 8-bit data to 16-bit data, twenty-six SYNC codes are added, per one data unit 2 to form sixteen data units 3 (step 309).

Hereafter, each data unit configuration will be described in detail.

First, 2064 bytes of data are configured as shown in FIG. 4, comprising 2048 bytes of main data (310), 4 bytes of identification data (ID401), IED (ID error Detection Code) 402 that is an ID error detecting code parity, 6 bytes of RSV (reservation bytes) 403 that is a reservation area, and 4 bytes of EDC (error Detection Code) 404. A data unit (after scramble) 1 (305) is a data unit in which the 2064 bytes of data are organized as twelve rows of 172 bytes each, where the 2048 bytes of main data part are scrambled.

Sixteen data units (after scramble) 1 (306) constitute a 192 rows of 172 bytes each in a data field 306 and are configured by combining sixteen instances of data units 1 (305) as shown in FIG. 5.

An ECC block 307 is a unit of error correction processing in DVD and is a product code (known as a cross Reed Solomon code). The product code is formed as follows. As shown in FIG. 6, an outer-code is configured by defining sixteen data units 1 as information data and treating each of 172 columns as RS (208, 192, 17); thus 16 rows of parity of outer-code PO 502 are added as error correction data. After that, an inner-code is formed by treating the resulting 208 rows as RS (182, 172, 11) in the same direction as the direction of a main data list and the recording direction in a DVD (parity of inner-code PI 501 is added as error correction data). A data unit 2 (308) is a data unit after the formation of the ECC block 307, and is a 13-row×182 byte data unit that is configured by interleaving each of the sixteen rows of PO 502 among the data units as shown in FIG. 7.

A data unit 3 (309) is a data train obtained by adding eight kinds (SY0-SY7) of synchronizing signals 801 (SYNC) at the head of each block at every 91 bytes of the data unit 2 as shown in FIG. 8. For example, SY0 (SYNC code 0) in the head of the unit, SY1-SY4 cyclically inserted in the head of each row, and SY5, SY6 and SY7 inserted for identification of each row, and performing 8/16 modulation converting 8-bit data into 16-bit data. Moreover, it is possible to identify a position of data, which is reproduced, in the data unit 3 with the generating pattern of SYNC 801 from an addition method of this SYNC 801 at the time of reproduction.

After such conversion from the data unit 1 to the data unit 3, data modulated into a DVD is recorded with NRZI (Non Return to Zero) conversion being performed.

Moreover, the list of main recorded data on the DVD does not change during the data format conversion process such as scramble, ECC encoding, and PO interleave. Hence, the list and sequence of recorded data on the DVD are equal to the list and sequence of main data.

Therefore, the recorded data on DVD is reproduced in a reverse process of data processing performed in FIG. 3.

Hereafter, conventional data processing at the time of DVD reproduction will be described by using FIG. 9

The 8/16 demodulation is performed while determining a position in the data unit 3 (902) by using SYNC 801, and the data unit 2 (903) is generated. Next, the PO interleave is reversed (deinterleaved) while determining a position of the data unit 2 in an ECC block by using ID 401, and an ECC block 901 corresponding to the ECC block 307 before error correction is formed.

The reproduction data from the DVD is susceptible to error from various factors. Hence, error correction to a maximum of 5 bytes per inner-code (normally, although each data constituting the code is expressed by "word" or "symbol" in error correction, here, the data is explained by using "byte" as an example of a data unit) is performed in the error correction to inner-code having the same list as a data list recorded in the DVD. The correction of an error, included in each outer-code, to a maximum of 16 bytes is performed, and error is removed by outer-code error correction. After that, error correction data PI 501 and PO 502 are removed from the ECC block 901, 16 data units 1 (305) shown in FIG. 5 is obtained.

The data of the data unit 1 (305) de-scrambled (304) and is restored into ID, IED, RSV and 2048 bytes of main data (303) again after performing the error detection processing by using EDC so as to verify that erroneous correction is not performed in the error correction processing.

The above is the overview of the data signal processing at the recording and reproduction of a DVD.

In the error correction processing in the reproduction of a DVD that is described by using FIG. 9, the error correction of a PI having an identical list with the one of the recorded data in the DVD is performed.

The relationship of data placement on DVD and data placement on ECC block is effective in view of making it possible to correct a comparatively long burst error by performing error correction, which uses a result as error position information in outer-code error correction after not letting errors, continuously arising as shown by black parts in FIG. 10C, dispersed, and several uncorrectable error arising in the inner-code error correction. The vanishing correction method is an error correction method of performing the correction by determining outer-code error positions using the correction result of the inner-code as described in this specification.

Nevertheless, an uncorrectable error arises in plenty of outer-codes when short burst errors randomly arising as shown by black parts in FIG. 10A pile on in a specific outer-code. Error correction is impossible for the burst error in the inner-code error correction, and the number of errors exceeds the number of correctable outer-code. (FIGS. 10B to 10D will be described later.)

Moreover, in connection with the increase of high-density recording data for increasing capacity, one or two bytes of error due to dust and scratches of a current DVD become a short burst error. Thus, the average length of time for error correction (byte length) increases, and it is estimated that the case that an uncorrectable error arises will increase.

As a countermeasure for these errors, there is an invention disclosed in JP-A-8-125548.

The invention disclosed in JP-A-8-125548 is a method of making a burst error dispersed in the entire product code by rearranging the predetermined data in the product code every several bytes. Nevertheless, in the product code having a ratio of inner-code to outer-code like a DVD, there is a problem of not being able to secure correction capability, which is equivalent to a conventional method, for a burst error over ten or more lines. This is because there is a case that, since the burst error is dispersed in the outer-code direction by performing the rearrangement between lines, an area of uncorrectable errors increases. On the other hand, the present invention does not let an error become dispersed in an outer-code direction because the present invention does not rearrange the data between lines, and hence it is possible to maintain the ability to correct for the burst error.

Moreover, this is different from the present invention in that a rearrangement range is the entire ECC block and arrangement rules are not changed every line.

Other countermeasures for these errors are described in JP-A-3-266264 and JP-A-9-54956. These inventions are going to raise the tolerance for an burst error by arranging words, included in code words in the column and row directions, so that the words may be mutually apart equally to or more than predetermined distance.

However, this invention is different from the present invention in that this invention does not change arrangement rules every line and performs rearrangement over plural lines, and there is a possibility of not being able to maintain the burst error length.

SUMMARY OF THE INVENTION

An object of the present invention to provide technology for raising correction capability of a short burst error, which is estimated to increase in future, while securing the correction capability, which is equivalent to conventional technology, for an burst error over several tens of lines.

Major means of the present invention for solving an above subject will be described below.

The present invention is a data recording method of recording data on a record medium, and is intended to improve error correction capacity by rearranging data in sequence per byte for a data train consisting of two or more bytes which constitute the error correcting code for recording data on this record medium and recording the data on the above-described record medium.

In addition, the present invention is intended to improve the error correction capacity by rearranging data per byte in sequence for parts of a data train except identification information out of the data train consisting of two or more bytes which constitute the error correcting code for recording data on this record medium, and recording the data on the above-described record medium.

Moreover, the present invention is intended to improve the error correction capacity by generating error correcting code through adding error correction data to the data for recording on this record medium, rearranging data, forming this data train, per byte about the data train which constitutes this error correcting code, demodulating the data train which is rearranged in its sequence for data per byte, and recording the modulated data train on the above-described record medium.

Further, the present invention is a data reproducing method that reproduces the data modulated and recorded on the record medium. The present invention is intended to improve the error correction capacity by demodulating the data train recorded on the record medium, restoring the data train, which is demodulated and rearranged according to the predetermined rule, to the data train in the sequence before being rearranged per byte for data forming the data train, correcting the errors that are included in the error correcting code restored to the data train in the sequence before being rearranged, and reproducing the data whose errors are corrected.

Furthermore, the present invention is a data recording apparatus recording data on a record medium. The present invention is intended to improve the error correction capacity by the data recording apparatus which comprises a circuit generating error correcting code for recording data on the record medium, a signal processing circuit which rearranges sequence for data per byte about a data train which consists of two or more bytes which constitutes the error correcting code, and a modulation circuit which modulates the data train which are rearranged in its sequence for data per byte.

Still further, the present invention is a data reproducing apparatus that reproduces data modulated and recorded on a record medium. The present invention is intended to improve error correction capacity by a data reproducing apparatus characterized in comprising a demodulation circuit which demodulates the data train recorded on the record medium, a signal processing circuit which restores the data which forms a the data train to the data train in the sequence before being rearranged in the sequence per byte about the data train that is demodulated by the demodulation circuit and is rearranged according to a predetermined rule, an error correcting circuit which corrects the errors included in the error correcting code restored to the data train before being rearranged by the signal processing circuit, a reproducing circuit which reproduces the data which had the error corrected by the error correcting circuit.

Thus, when the byte interleave for each row (here, the row has the same list as the data list recorded on the record medium) of a product code is performed under a rule different every row, that is, when data rearrangement is performed according to the rule which is different every inner-code of the ECC block 307 in a DVD, several bytes to several tens bytes of short burst error is dispersed in degree different every row. Hence, conventional errors shown in FIG. 10A become errors shown in FIG. 10B. Since an error count is equalized on outer-code in FIG. 10B even if uncorrectable errors are generated in the outer-code error correction in FIG. 10A, the probability of further decreasing the errors included in data by the outer-code error correction becomes high.

This effect means that it becomes possible to obtain characteristics of error correction still better than those of a current DVD by performing the repetitive decoding, which performs the same error correction repeatedly again, after performing error correction to inner-code and error correction to outer-code that are effective to random errors.

Furthermore, if performing interleave processing within each row of the product code, it becomes possible to secure the burst correction length the same as the former. This is because data dispersion does not occur in the direction of line of data formed by outer-code, even if the error generated like FIG. 10C is set to FIG. 10D by the byte interleave.

Thus, in the present invention, an error count is equalized even at the time of an uncorrectable error arising conventionally, without changing burst correction length by performing the byte interleave every row of a product code under a rule different every row, rearranging the data by using a rule different every row, and making the data dispersed so that several bytes to several tens bytes of short burst error may have not correlation. Hence, the probability that more errors can be corrected becomes high. Moreover, in many cases, in the repeat correction having the excellent capacity to a random error, it also becomes possible to correct errors more than those in the past in a repeat count equal to or less than that in the past.

BRIEF DESCRIPTION OF THE DRAWINGS

FIGS. 16A and 16B are block diagrams showing examples of M-series generating circuits;

FIGS. 17A and 17B are block diagrams showing examples of M-series generating circuits;

DESCRIPTION OF THE EMBODIMENTS

Hereafter, the present invention will be described by using drawings. Here, the present invention will be described by making a DVD data reproducing system, and a data recording system be examples.

Figure 1:
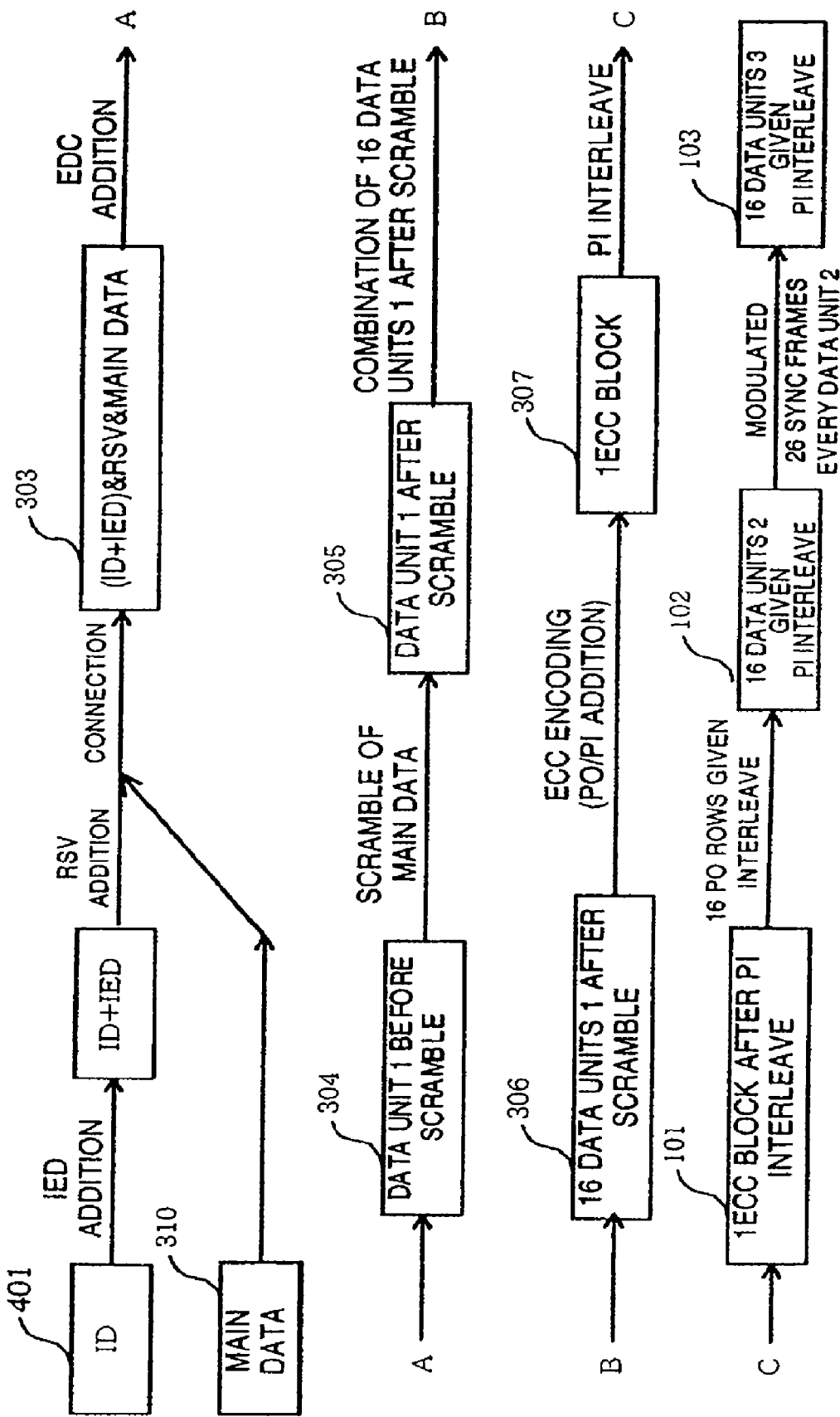
FIG. 1 is a block diagram showing a data processing flow at the time of recording when the present invention is applied to a DVD.
Figure 3:
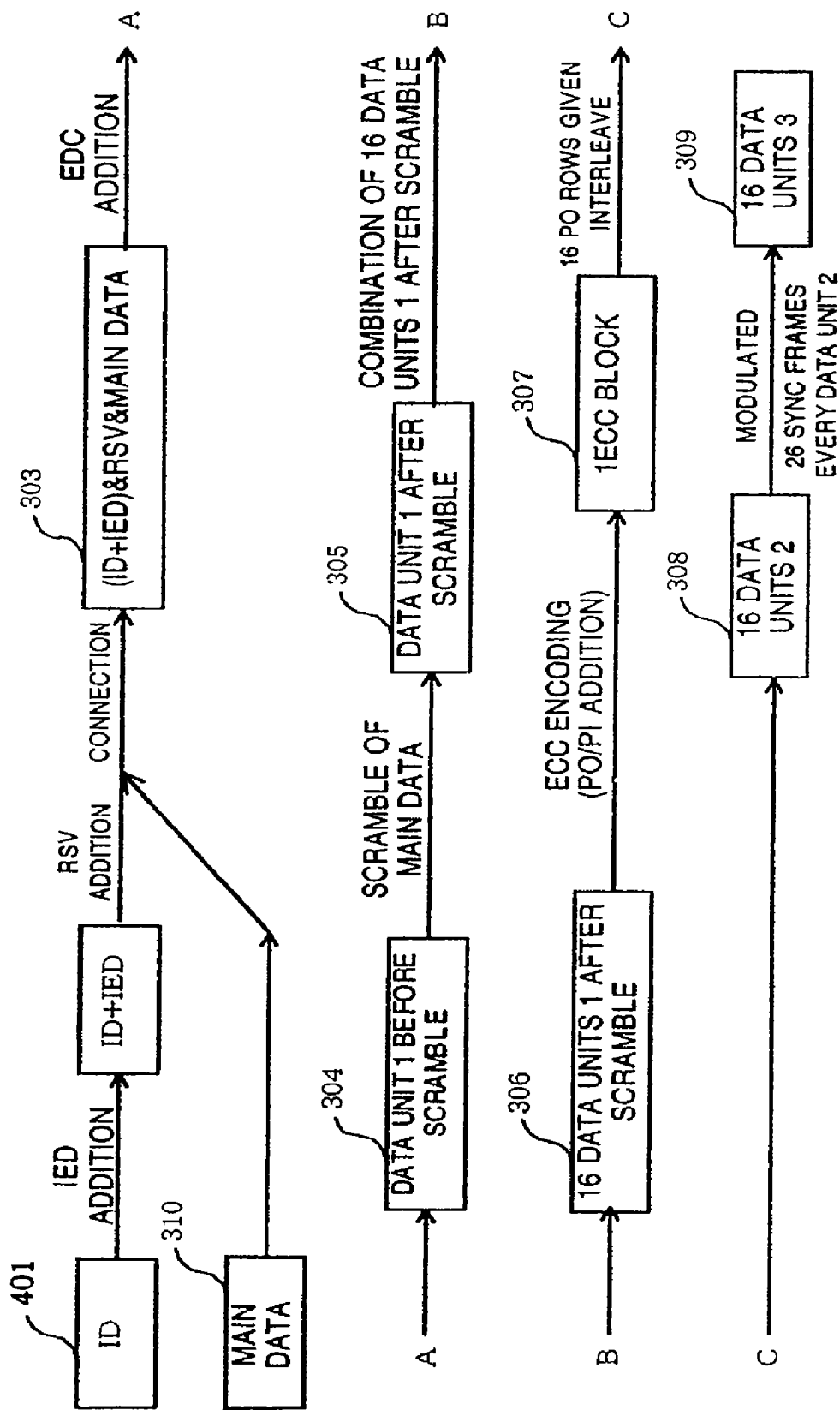
FIG. 3 is a block diagram showing a data processing flow at the time of recording of the DVD.

FIG. 1 shows an example of showing data processing steps at the time of recording when the present invention is applied to a current DVD logical format shown in FIG. 3.

Figure 4:
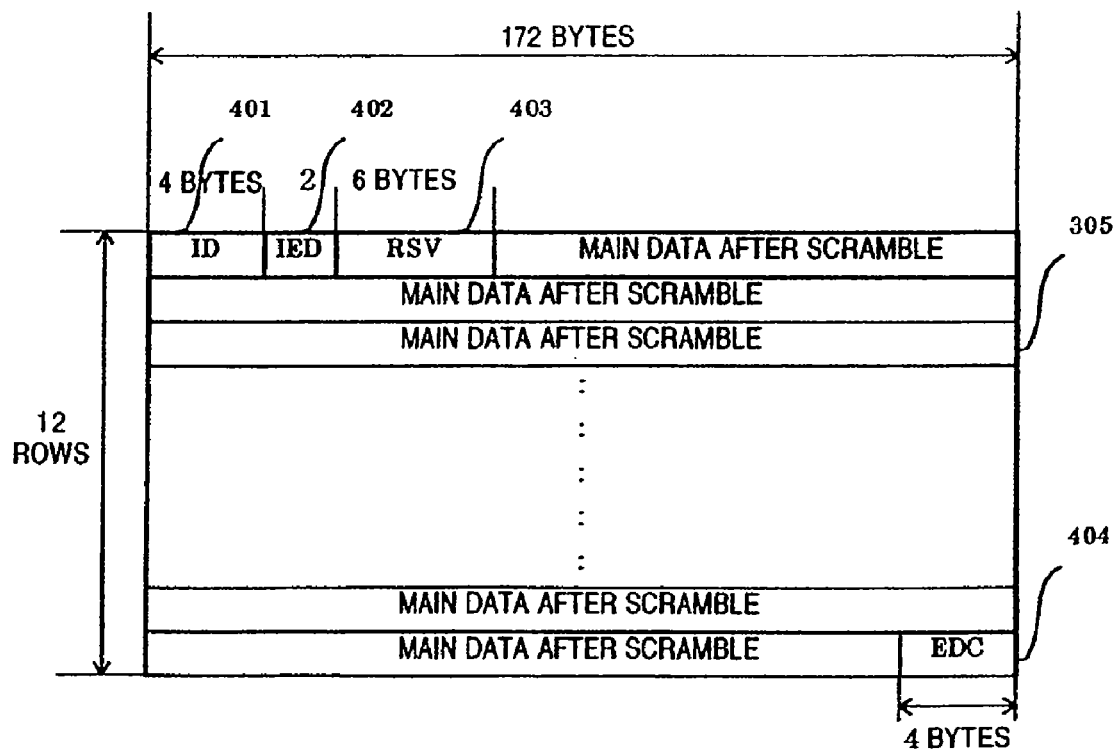
FIG. 4 is a diagram showing a data unit 1 after scramble.

FIG. 1 will be briefly described. The main recorded data 310 is divided into 2048 bytes. In each head, as shown in FIG. 4, 4 bytes of identification data (ID) 401, IED (ID error Detection Code) 402 that is ID error detecting code parity, and 6 bytes of RSV (reservation bytes) 403 that is a reservation area are added. Furthermore, 4 bytes of error detection code parity (EDC) is added to 2060 bytes of this data stream, then 2064 bytes of data unit (before scramble) 1 (304) is organized into twelve rows of 172 bytes each. Next, according to a scramble rule determined with the value of the ID part of the data unit 1, scramble processing is performed on the 2048 bytes of the main data part to produce a data unit (after scramble) 1 (305) which is twelve rows×172 bytes. Furthermore, sixteen rows of Parity of Outer-code (PO) data is added to a 192 row×172 byte data field comprising sixteen data units 1 (306), to produce a 208-row data field. Next, ten bytes of Parity of Inner-code (PI) is added to each of the 208 rows to form one ECC block (307) which is a 208 row×182 byte cross Reed-Solomon code. Next, in a PI interleave operation, the data in each row of the ECC block is rearranged on a byteby-byte basis according to each rule to obtain an interleaved ECC block 101. Then, a PO interleave operation interleaves each of the 16 rows of PO (and PI) data among the sixteen data units 1 of the original 192 rows in the data field. Then, 8/16 modulation is performed to convert all data into 16 bits from 8 bits, followed by the incorporation of twenty-six SYNC codes for each data unit 2 to form data units 3 (103).

However, although PI interleave is performed immediately after ECC block generation in FIG. 1, naturally, it is no problem to perform PI interleave after constituting the data unit 2, or after constituting the data unit 3.

Moreover, the "word" and the "symbol" which are the unit of data are also described as a "byte" here.

Figure 2:
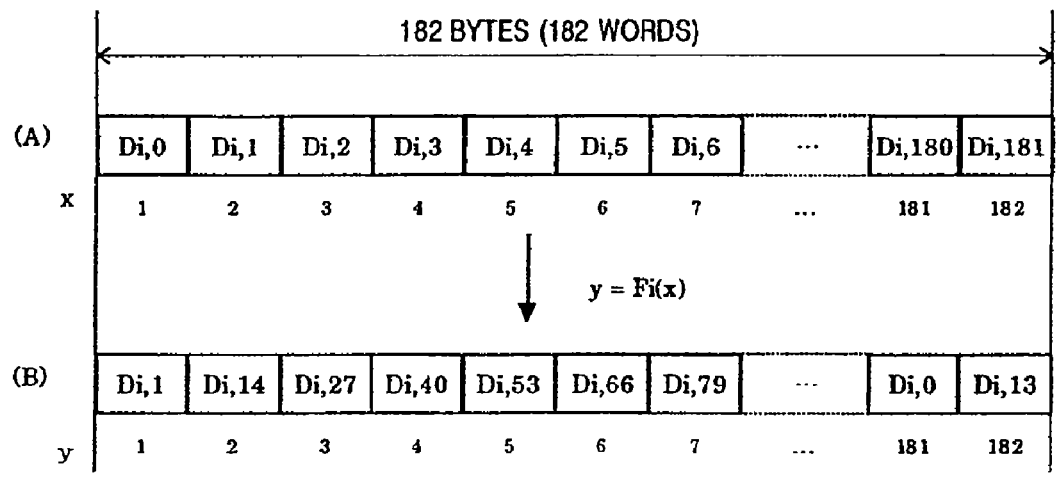
FIG. 2 is a diagram showing an example of PI interleave.

In FIG. 1, the added PI interleave operation is a byte interleave operation based on a certain rule for rearranging the sequence of 182 bytes of data (inner-code) of each row in the ECC block of DVD as shown in FIG. 2. That is, the added PI interleave operation shows the processing for rearranging the byte sequence about the data train which consists of a plurality of bytes constituting error correcting code. Here, the data train means an inner-code forming the ECC block, that is, an arrangement of the data in the row direction. At this time, the effect in the point of dispersion of errors becomes large by using conversion rules (interleave rules, $F_i(x)$) that have no correlation and are different from one another in the 208 rows of inner-code included in the ECC block. However, it is possible to obtain the effect of error dispersion even if this PI interleave is performed by using at least two kinds of conversion rules (interleave rules) $F_1(x)$ and $F_2(x)$. Moreover, data Di, 0; Di, 1; Di, 2; . . . ; Di, 181 show the data constituting the inner-code in the i-th row of an ECC block, and Di, 171; Di, 172; . . . ; Di, 181 correspond to the parity of inner-code PI. Therefore, the data train (B) generated by performing PI interleave operation on the data train (A) is not always innercode.

It is also possible to perform PI interleave, which rearranges the record sequence of this data, among a plurality of inner-codes. In this case, although it becomes possible to obtain still higher correction capacity to a random error, burst error length become short.

Figure 6:
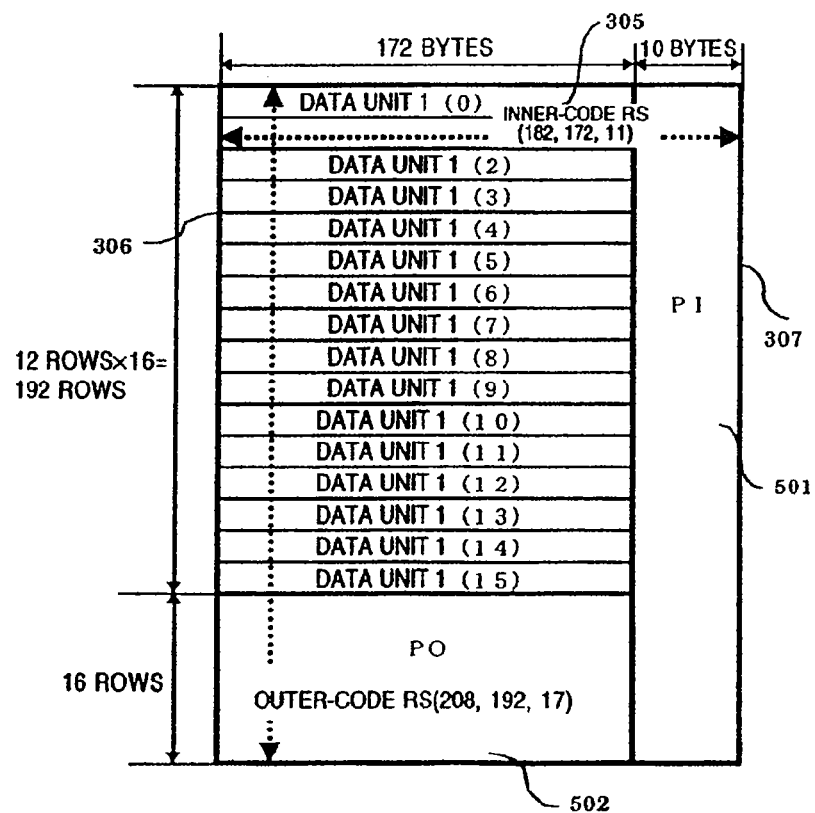
FIG. 6 is a diagram showing an ECC block.
Figure 7:
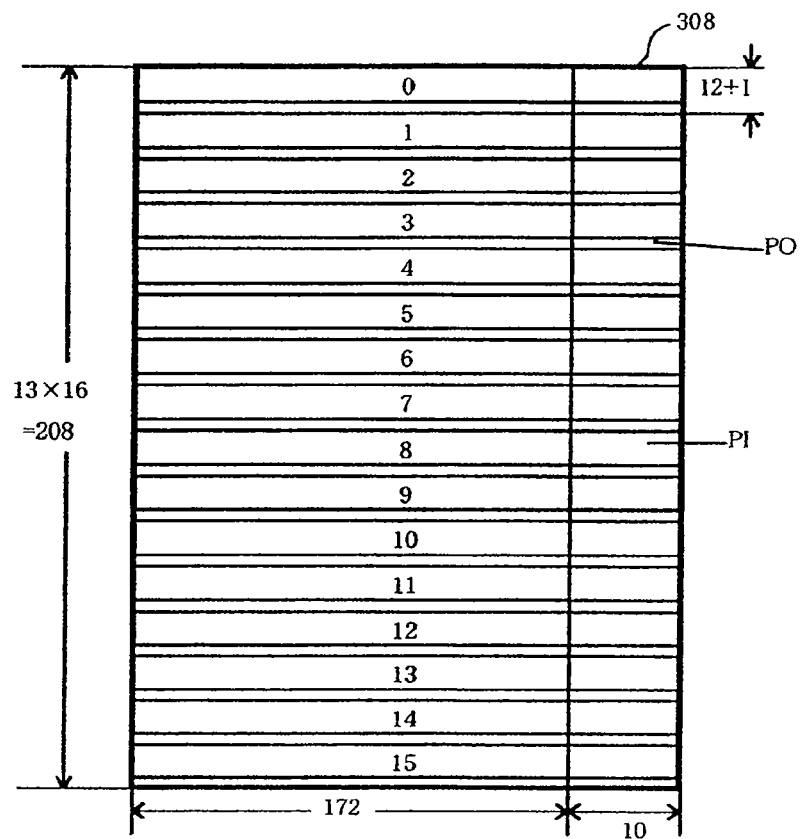
FIG. 7 is a diagram showing 16 data unit 2.
Figure 8:
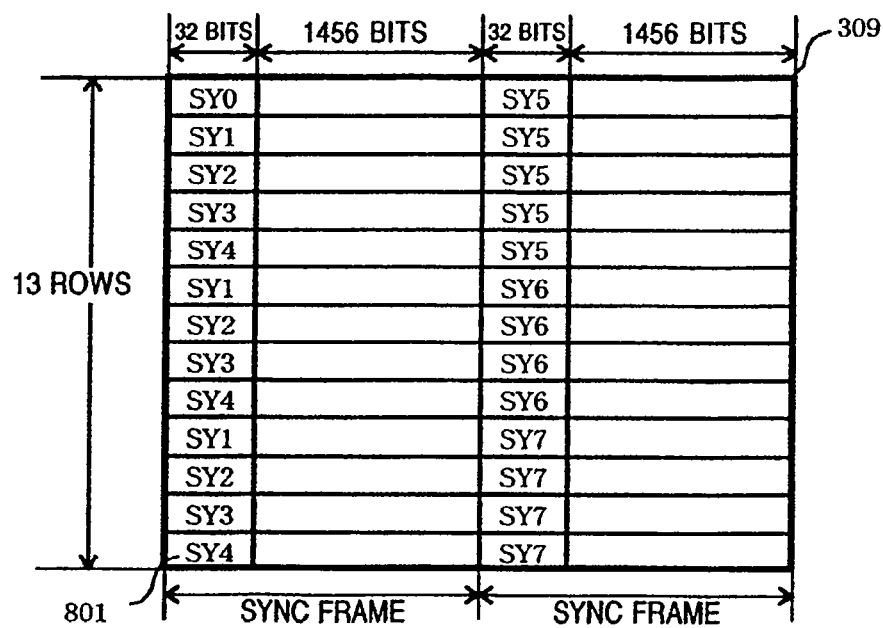
FIG. 8 is a diagram showing a data unit 3.
Figure 9:
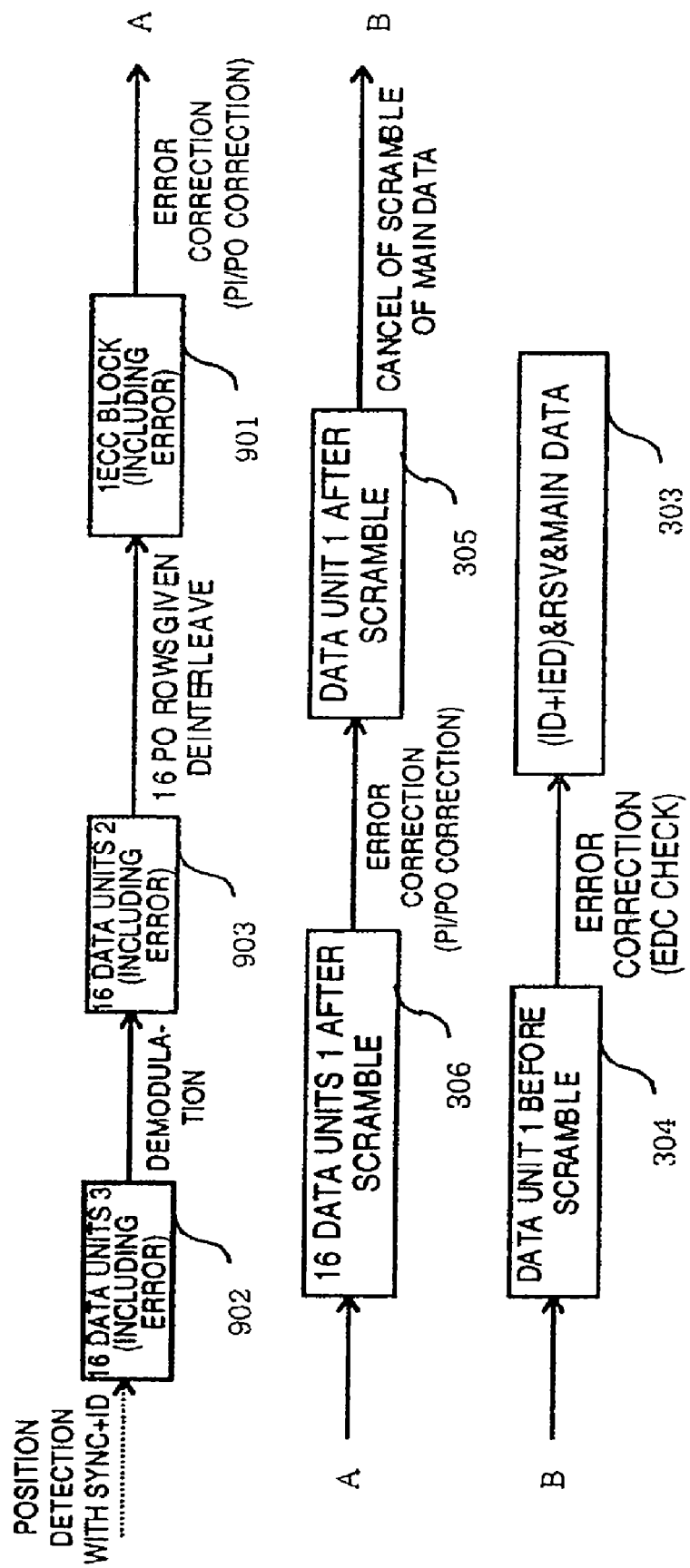
FIG. 9 is a block diagram showing an example of a data processing flow at the time of reproduction of the DVD.
Figure 10A:
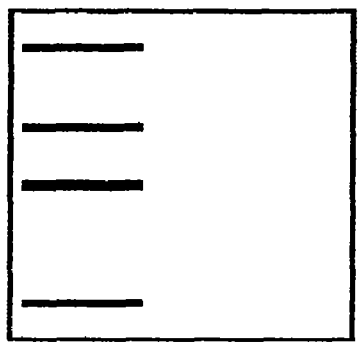
FIGS. 10A-10D are drawings showing an effect at the time of PI interleave for a short burst error and a long burst error.
Figure 10B:
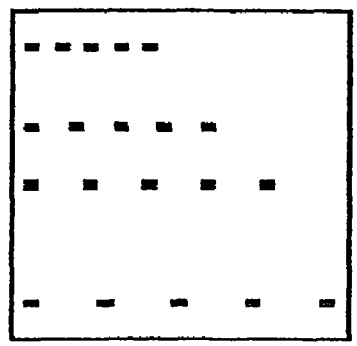
Figure 10C:
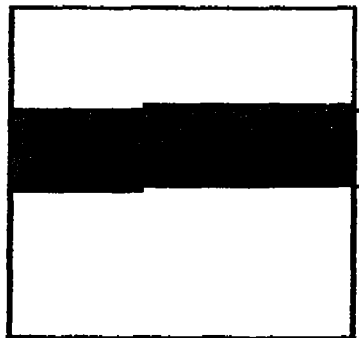
Figure 10D:
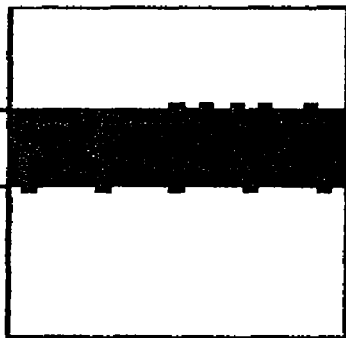
Figure 11:
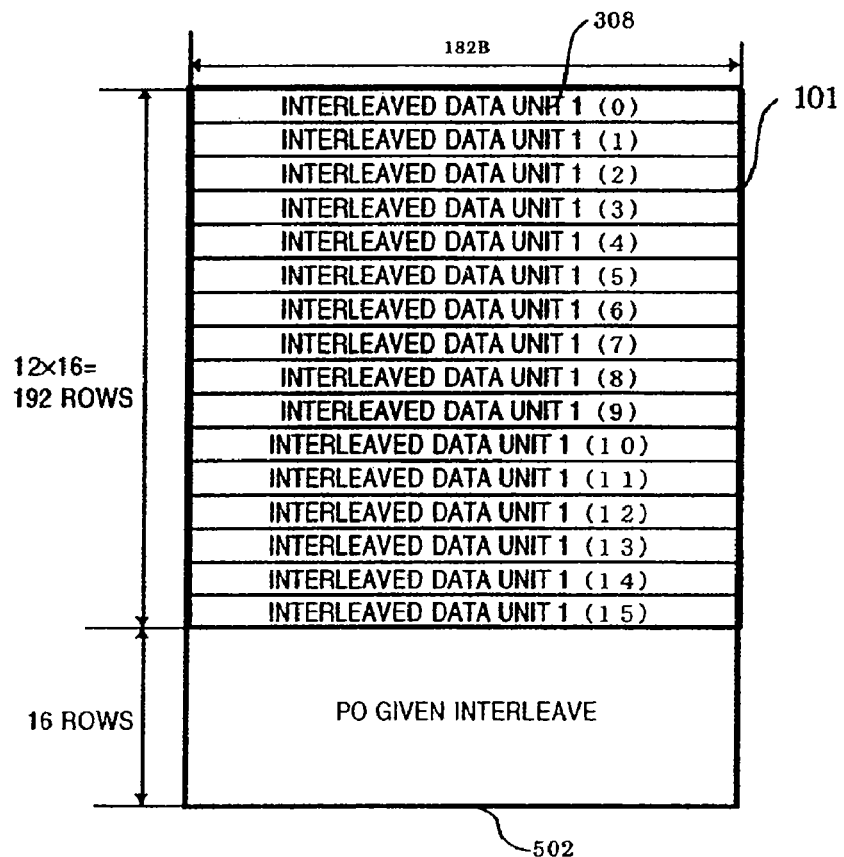
FIG. 11 is a diagram showing one ECC block after PI interleave.

FIG. 11 is a diagram showing an ECC block (101) after performing the PI interleave shown in FIG. 1. This shows the status that each row of the ECC block shown in FIG. 6 is given PI interleave and is transformed.

Figure 12:
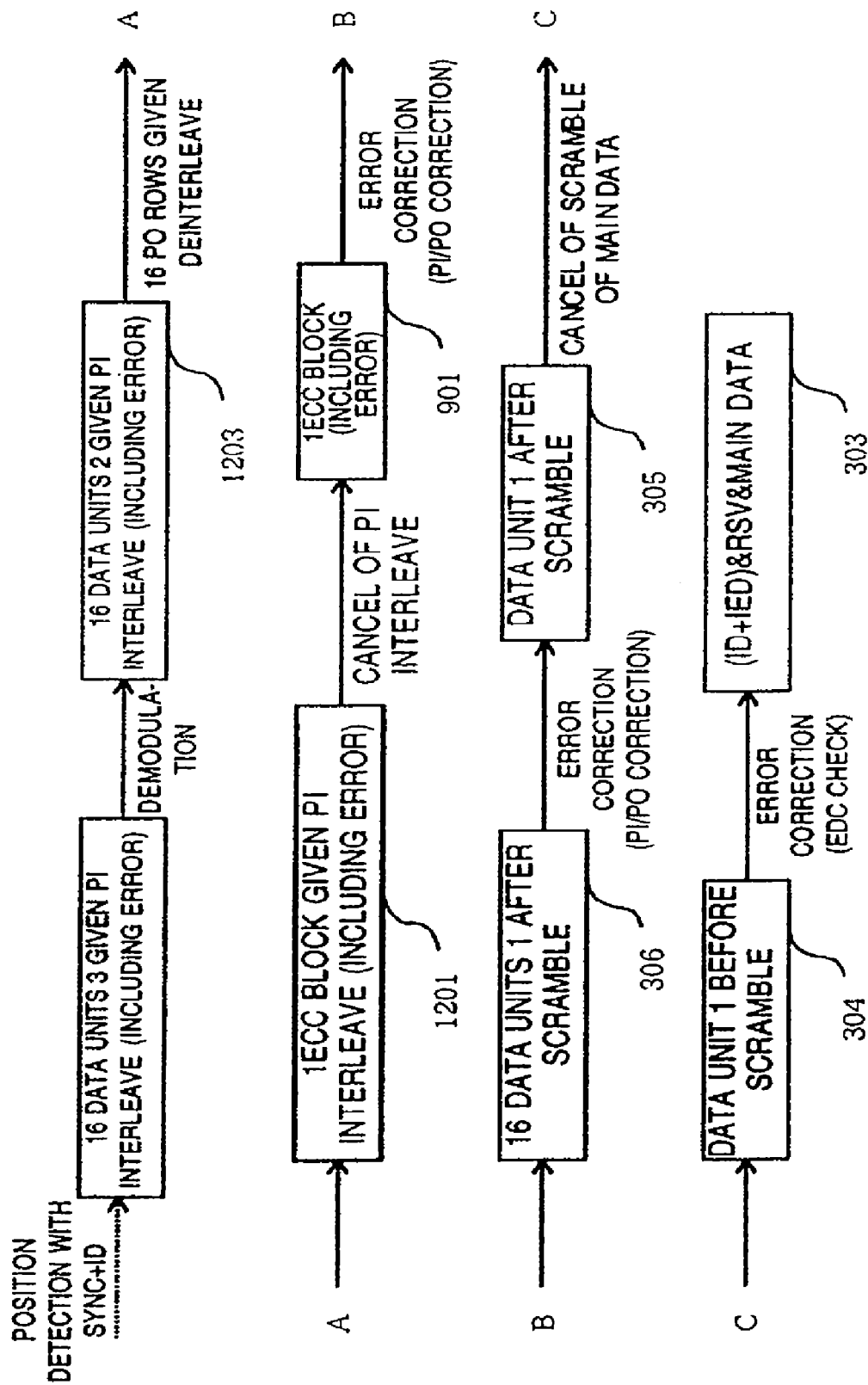
FIG. 12 is a block diagram showing a data processing flow at the time of reproduction when the present invention is applied to the DVD.

FIG. 12 shows a data conversion flow at the time of recording data, generated after performing the data conversion process shown in FIG. 1, on a DVD and reproducing the data.

Figure 5:
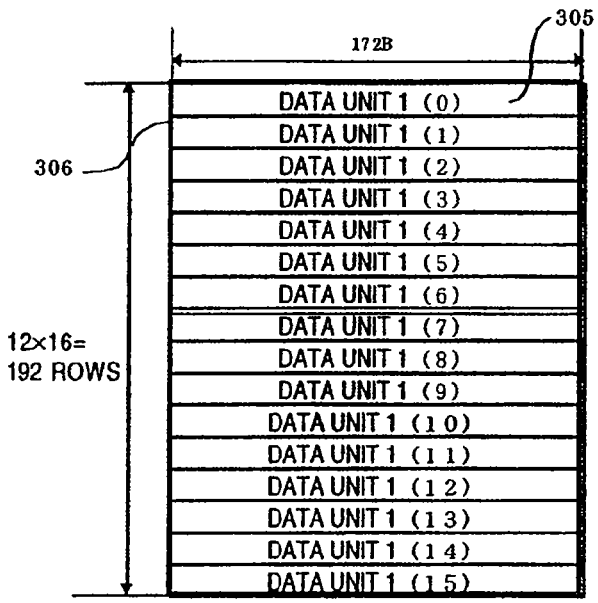
FIG. 5 is a diagram showing 16 data units 1 after scramble.
Figure 13:
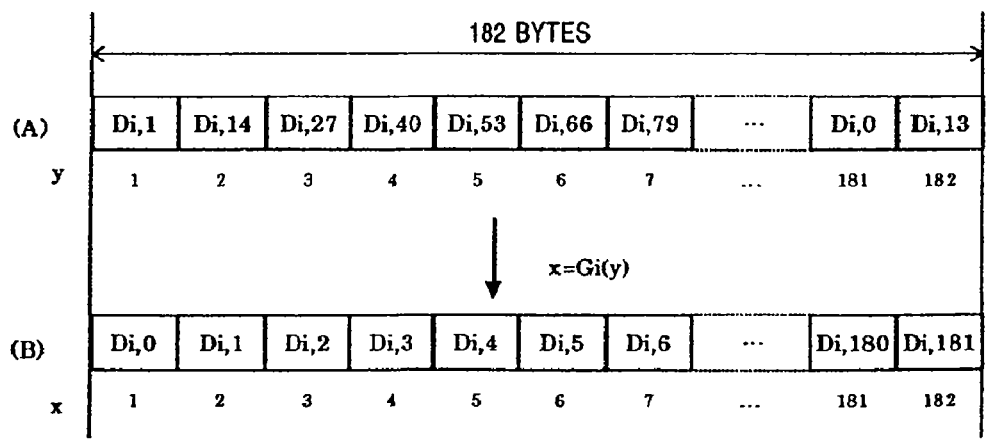
FIG. 13 is a diagram showing an example of processing for canceling PI interleave (deinterleave)

In FIG. 12, a data unit 2 (1203) is generated from the data that is recorded on the DVD while determining the position in the data unit 3 by using SYNC801, and performing 8/16 demodulation. Next, a PO deinterleave operation is performed to produce an ECC block (1201) as shown in FIG. 11, while determining the position of the data unit 2 in the ECC block 307 by using ID401. The PO deinterleave operation is the inverse of the operation shown in FIG. 1 where the PO row was inserted after every twelfth row. Then, the ECC block (1201) is restored to an ECC block (901) shown in FIG. 6 by applying the conversion rule $G_i(y)$, which is the inverse transformation of $F_i(x)$ and is shown in FIG. 13. Thus, the bytes in each row are reorganized according to the inverse function $G_i(y)$ to restore the symbol train (A) from the symbol train (B). After this, as usual, an error of up to 5 bytes is corrected in each inner-code by the error correction to inner-code, and an error of up to 16 bytes, included in each outer-code, by the error correction to outer-code is corrected (306). Then, ID, IED, RSV, and 2048 bytes of main data (303) are obtained again after removing the data PI and PO for error correction required for error correction processing, restoring the ECC block to the 16 data unit 1 (305) shown in FIG. 5, canceling scramble (304), and performing error detection processing by using EDC. In addition, as for conversion rules $F_i(x)$ and $G_i(y)$, the apparatus may have the information as rules defined beforehand. Alternatively, the conversion rules $F_i(x)$ and $G_i(y)$ may be recorded on the medium itself, and the apparatus may read the information. In the latter case, it is possible to perform the above-described processing after reading conversion rules $F_i(x)$ and $G_i(y)$ first, and to determine the conversion rules $F_i(x)$ and $G_i(y)$ for every disk unit, ECC block unit, frame unit, or the like in the apparatus.

However, in the demodulation process shown in FIG. 12, the position in the ECC block is determined by using the ID. Thus, if a PI interleave operation is performed where the interleave function $F_i(x)$ varies for each row, it is not possible to determine $x=G_i(y)$ at the time of restoring a data train since a conversion rule $y=F_i(x)$ for PI interleave for a row including ID cannot be found. Hence, it becomes very difficult to seek the ID.

Therefore, the information showing the position in a product code is shown, that is, ID and IED (IED is also required when the reliability of ID is required) are not subjected to any data interleave operation on a DVD. Consequently, rows including this information are subject PI interleave processing by processing only 176 bytes (e.g., bytes 7 through 182) of data and leave the 6 bytes of identification information such as ID and IED unaltered.

Figure 14:
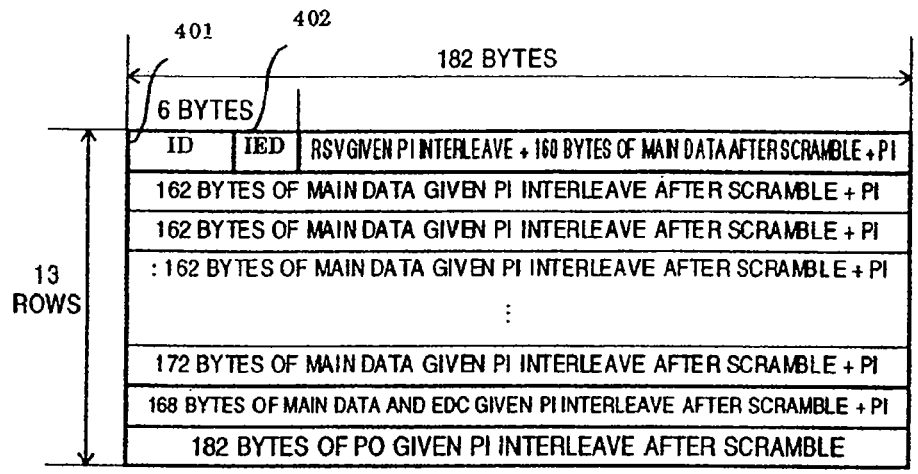
FIG. 14 is a diagram showing an example of a data unit 2 after PI interleave.

When this is applied to a DVD, the data unit 2 (102) shown in FIG. 1 becomes as shown in FIG. 14. In this case, identification information containing EDC, RSV, etc. cannot be obtained until the code is decoded into the original inner-code by performing PI deinterleave since all the data except ID and IED are set as the objects of scramble.

Therefore, although the effect of PI interleave becomes a little weak when the information which is needed before forming an ECC block in RSV etc. at the time of reproduction is included, it is necessary to remove the data as well as ID from the objects of the interleave.

Moreover, as shown in FIG. 14, if removing ID and IED from the objects of PI interleave, in regard to the conversion rules $F_i(x)$ of the inner-code including ID and IED, it is assumed that $x=1, \ldots, 182$ and the values of x show position addresses as shown in FIG. 2. The function can be revised to so that $F_1(n)=n$ (for n=1, 2, 3, 4, 5, and 6), or the function can made to limit x to be in the range of 6 to 182.

FIG. 2 on which is briefly touched above will be described again. FIG. 2 is an example of a diagram having shown the method of a data list at the time of adopting PI interleave with the conversion rule $F_i(x)$ for PI interleave to the inner-code described in FIG. 6 where the present invention is described above. An inner-code is 182 bytes of data train, data (A) denotes the inner-code after the addition of PI and PO, and data (B) denotes 182 bytes of data train which is given PI interleave by the conversion rule $F_i(x)$ and is rearranged in the sequence of data thereof. Here, although the data (B) is an example of rearranging data every 13 pieces, the conversion rule $F_i(x)$ is not limited to this, but is enough to discontinuously rearrange the data.

Two or more kinds of conversion rules $F_i(x)$ are prepared in order to perform different values of PI interleave. In a DVD, the conversion rules of up to 208 kinds are prepared, and error counts on outer-codes in an ECC block are equalized as shown in FIGS. 10A to 10D by applying the different conversion rule for every inner-code. Hence, cases that error correction to outer-codes become possible increases. Thus, it becomes possible to increase correction capacity by performing different PI interleave to the inner-codes and recording the inner-codes on a record medium. Moreover, this effect becomes still larger when the code is decoded repeatedly.

Next, a method of implementing the conversion rule for this PI interleave in a circuit will be described. First, an example of a configuration of a DVD recording and reproducing apparatus according to the present invention will be described by using FIG. 15. Although a recording and reproducing apparatus is described as an example here, the present invention is applicable also to a reproduction dedicated device and a record dedicated device.

An optical pickup 1502 performs record and reproduction of data on a record medium 1501 such as a DVD, and a spindle motor 1503 rotates a disk. Moreover, a servo 1504 controls the optical pickup 1502 or the like. A read channel 1505 performs waveform equalization and doubling of an analog reproductive signal read from the record medium 1501, and synchronous clock generation. A decoder 1506 consists of a demodulation circuit 1507 performing 8/16 demodulation of data read, and an error correcting circuit (1508, 1518) performing the processing of removing errors included in the data, and RAM 1509a temporarily stores the data at the time of reproduction. RAM 1509b temporarily stores the data at the time of record. This can be also used as the RAM 1509a. Numeral 1514 is a laser driver. A modulation circuit 1512 performs the modulation of the data at the time of record, and an encoding circuit 1513 consists of an error correcting code generation circuit adding parity of error correcting code, PI and PO, and a scramble circuit performing scramble processing. An interface 1515 controls the input/output of data with a host system, and a microcomputer 1516 generalizes the system. In addition, it is also possible to use a microcomputer as the error correcting code generation circuit adding the error correcting code parity PI and PO.

A PI interleave circuit (signal processing circuit which rearranges the data in an inner-code as shown in FIG. 2) 1517 implements the present invention, and a PI deinterleave circuit 1518 is a signal processing circuit which performs cancellation of PI interleave and processing shown in FIG. 13. That is, the PI interleave circuit 1517 rearranges the sequence of word bytes for the data train which consists of a plurality of word bytes who constitutes an error correcting code, and the PI deinterleave circuit 1518 restores the data train, which is rearranged, to the data train in the sequence before being rearranged.

The PI interleave circuit 1517 has SRAM and a register which can store at least 182-byte data in a system where PI interleave closed within one inner-code is performed. Hence, the PI interleave circuit 1517 reads data every inner-code from the RAM 1509b after ECC block generation at the time of record, and temporarily stores the data in the sequence at the time of being read, that is, in the form of an inner-code in the register. After that, the PI interleave circuit 1517 writes the data on the register again in RAM 1509b while converting the data list according to predetermined PI interleave conversion rules.

The PI deinterleave circuit 1518 has SRAM and a register which can store at least 182-byte data in a system where PI interleave closed within one inner-code is performed. At the time of the reproduction after data is read from a DVD, the PI deinterleave circuit 1518 reads data from the RAM 1509a every inner-code immediately after 8/16 demodulation and temporarily stores the data in the register in the present sequence. After that, the PI deinterleave circuit 1518 writes the data on the register again in RAM 1509a while converting the data list according to predetermined PI interleave conversion rules. Moreover, similar processing can be also performed in the following configuration. That is, in the PI deinterleave circuit 1518, the numbers of SRAM and registers are increased, and arranged just after the demodulation circuit in the decoding circuit 1508, and the data outputted from the demodulating circuit is directly inputted into the register so that the data train having the byte count equivalent to the count of the inner-code is arranged. Then, the PI deinterleave circuit 1518 arranges the data, saved in the register, in the RAM 1509a while performing PI deinterleave of the data.

Figure 19:
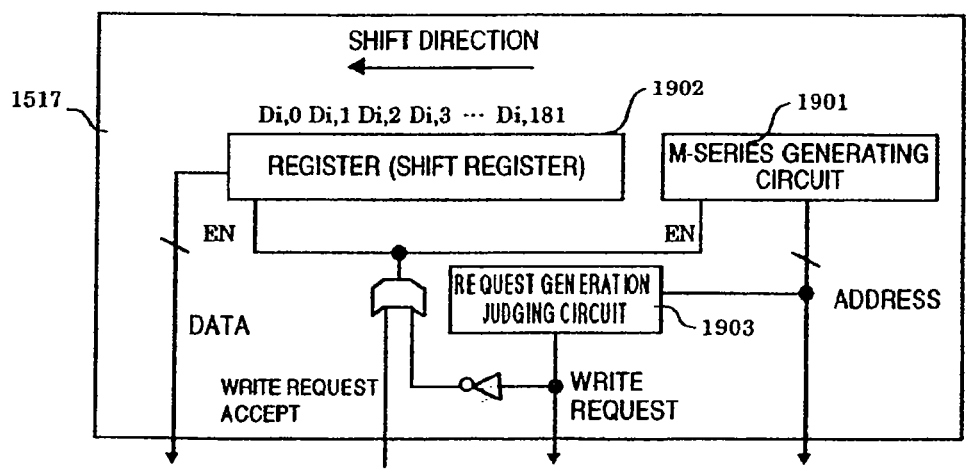
FIG. 19 is a block diagram showing an example of a PI interleave circuit.
Figure 15:
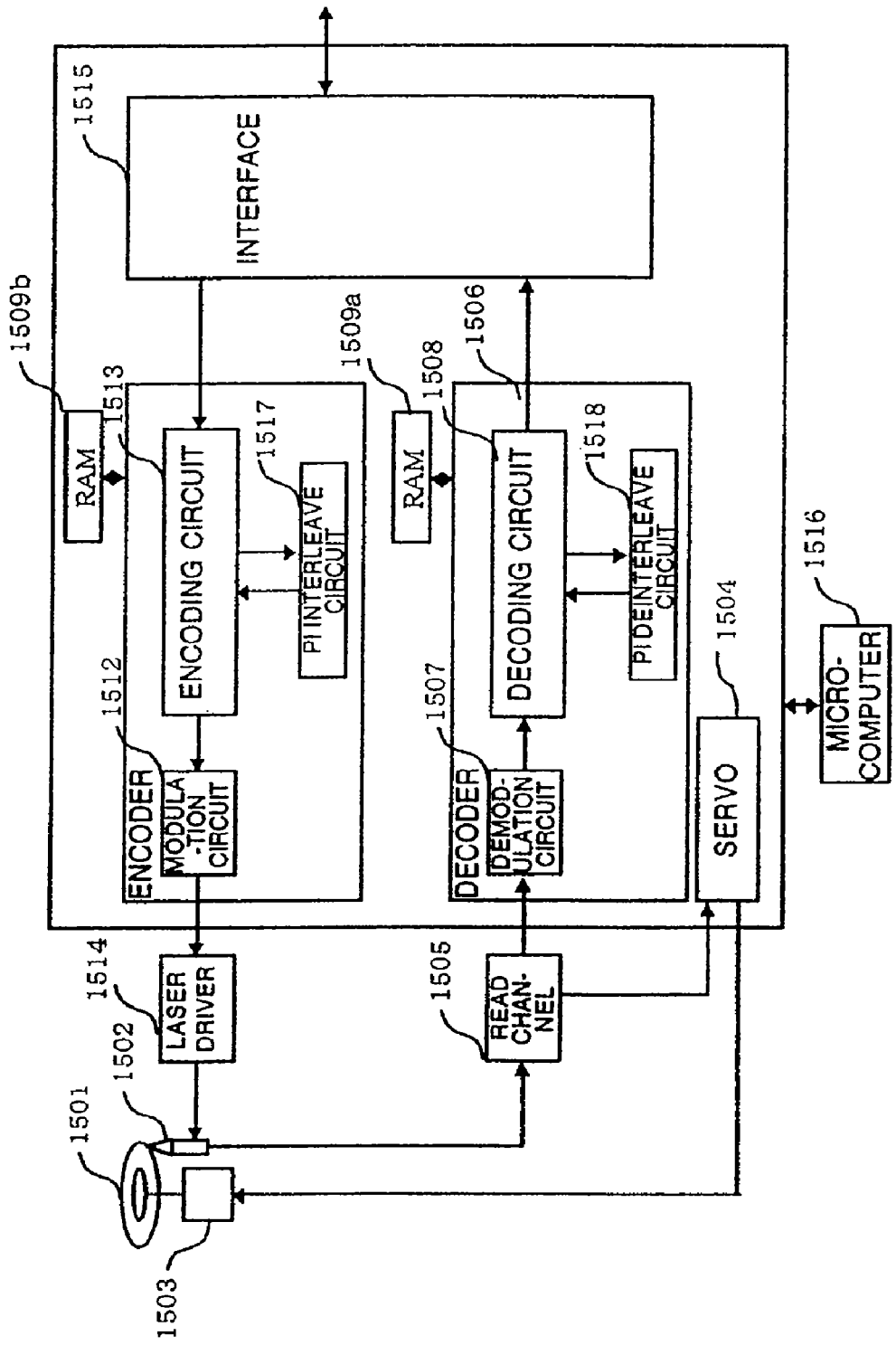
FIG. 15 is a block diagram showing an example of a DVD recording and reproducing apparatus to which the present invention is applied.

Next, a PI interleave circuit and a PI deinterleave circuit that are shown in FIG. 15 will be described. FIG. 19 shows an example of the PI interleave circuit 1517 where PI interleave conversion rules are defined by using the M-series generating circuit 1901, which is a circuit that generates the maximum periodic column; e.g., the maximum period column ([=]referred to as the M-series) is 255 in the case of using an 8-bit register (i.e., $2^8-1$). Moreover, here, it is assumed that the inner-code read from the RAM 1509b has been already stored in a shift register 1902. As write control signals to the RAM 1509b, there are a write request signal, an address (however, referred to as 1 to 182 for convenience here) in the RAM 1509b, and write data. When the write request signal is outputted, a write request acknowledge signal, which shows that data is written, is inputted from the RAM 1509b.

In this circuit, when the write request acknowledge signal is inputted, that is, the timing when the data is written, the shift register 1902 shifts. Moreover, the M-series generating circuit 1901 also changes to the following value if the write request acknowledge signal is inputted, or if the signal of 1 to 255 generated by the M-series generating circuit 1901 exceeds the address to be required, i.e., if the signal has the value of 183 or more. Here, the value range is not necessary to be 1 to 255. In a DVD, the inner-code is 182 bytes, and PI interleave in the data in all the inner-codes is concerned here. Hence, an output from the 8-bit M-series generating circuit is used. Moreover, the write request signal is outputted when the address made in the M-series generating circuit 1901 is determined to be 182 or less by a request generation judging circuit 1903.

This is to make an address skipped if the address made in the M-series generating circuit 1901 exceeds 183, because PI interleave processing cannot be performed.

Figure 20:
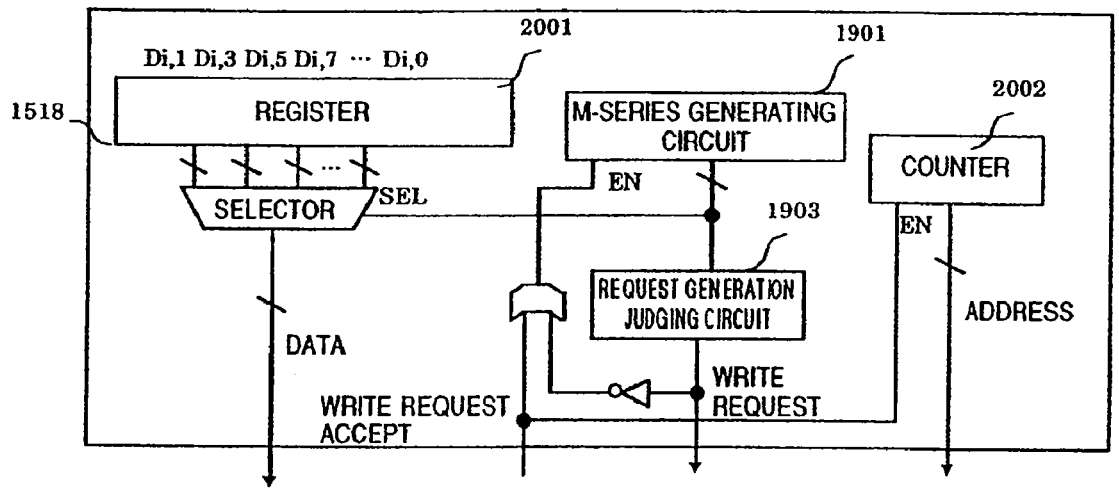
FIG. 20 is a block diagram showing an example of a PI deinterleave circuit (circuit which cancels PI interleave)

FIG. 20 shows an example of the PI deinterleave circuit 1518 where PI interleave conversion rules are defined by using the M-series generating circuit 1901. Moreover, here, it is assumed that the data train read from the RAM 1509a has been already stored in a register 2001.

As write control signals to the RAM 1509a, there are a write request signal, an address in the RAM 1509a, and write data. When the write request signal is outputted, a write request acknowledge signal, which shows that data is written, is inputted from the RAM 1509a.

In this circuit, when the value of the same M-series generating circuit 1901 as the M-series generating circuit 1901 where the PI interleave conversion rules are defined exceeds 183, the following value is outputted from the M-series generating circuit 1901. When the value is 182 or less, a write request is generated, and one byte of data in the data train chosen with the value of this M-series generating circuit 1901 is written in the address which a counter 2002 shows. Moreover, since a write request acknowledge signal is inputted when writing is performed, the counter 2002 which generates an address shows the following value, and the M-series generating circuit 1901 also shows the following value.

In this circuit also, it is necessary to skip an address if the address made in the M-series generating circuit 1901 exceeds 183, because PI deinterleave processing cannot be performed.

Moreover, in these circuits, if an address is 1 to 6 in the request generation judging circuit in the inner-code containing ID, the address is treated similarly to a case of being 183 or more. When overwriting the data train, which is given PI interleave, to the original inner-code of the RAM 1509$b$, i.e., the inner-code stored in the register 1902, it is not necessary to write ID and IED in the RAM 1509$b$. Moreover, when storing the data train in another area of the RAM 1509$b$, a system writing ID and IED in a predetermined position is added.

However, a countermeasure for the inner-code containing ID can be easily achieved by adding an offset to an address, or the like.

Many kinds (208 or more kinds required of PI interleave conversion rules which are different in all inner-codes in a DVD) of M-series defining PI interleave rules that are used in FIGS. 19 and 20 can be generated in the following combination.

This can be easily implemented by combining the following items 1 and 2.

1. Changing of the kind of feedback of the shift register generating M-series (corresponding to the relation between FIGS. 16A and 16B).

2. Rearrangement of the position of data outputted from the shift register (corresponding to the relation between FIGS. 16A and 17A).

For example, it is assumed that the positions of the data outputted from the shift register in 13 inner-codes in the data unit 2 are rearranged by changing the feedback rules of the M-series generating circuit every unit of the data unit 2 in FIG. 1, i.e., every unit of the data unit in FIG. 14. Then, it is possible to obtain 208 kinds of different PI interleave conversion rules.

Moreover, different M-series can be also generated by changing the value of a certain bit as shown in FIG. 17B. However, since zero may be outputted from M-series in this case, and a value at the time of the register being zero and an address is not generated at the value "AA=170" in hexadecimal notation in FIG. 17B, it becomes necessary to 0x170 from the obtained value to produce a suitable address. However, these can be used as M-series that define PI interleave rules. Moreover, similarly, it is clear that an address can be converted by using a logic circuit obtained by combining OR, AND, and NOT.

Figure 23A:
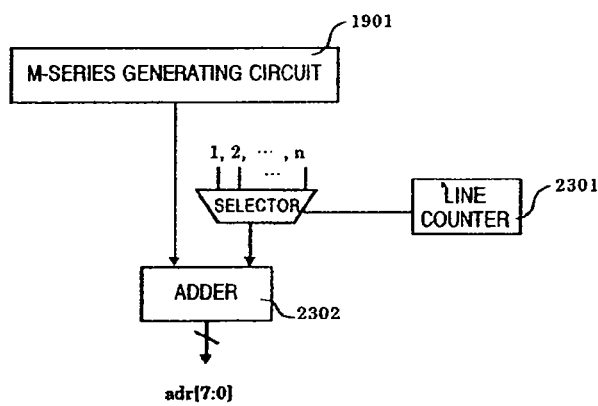
FIGS. 23A and 23B are block diagrams showing examples of respective M-series generating circuits.

As shown in FIG. 23A, values obtained by adding values different in every row (however the same row fixed value) to the value outputted from each M-series generating circuit 1901 in FIGS. 16A, 16B, 17A, and 17B that are shown above are also M-series. Hence, the M-series can be used as PI interleave conversion rules according to the present invention. However, in this case, a carry to the ninth bit (MSB) that is generated by performing addition is ignored.

Figure 23B:
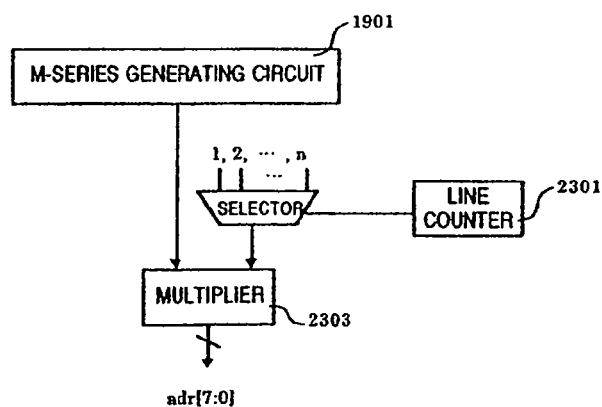

Moreover, values obtained by substituting a multiplier 2303, as shown in FIG. 23B, for an adder 2302 in this diagram, and multiplying the fixed value corresponding to each row on a finite field GF (28) are also M-series. Hence, the M-series can be used as PI interleave conversion rules according to the present invention. A line-counter 2301 counts the position of the inner-code in a product code, i.e., a line address.

As a method of generating a plurality of PI interleave conversion rules that is for achieving the object of the present invention to performs PI interleave, that is, for making burst errors, produced at random per several bytes, equally dispersed in all outer-codes, and is a simplest circuit, there is a method of changing the initial value of the M-series generating circuit 1901 shown in FIG. 19 according to a row. This means that M-series generated by the same M-series generating circuits 1901 are generated by shifting the M-series. As an example, there is a method of substituting a row address as the initial value of each PI interleave conversion rule. Thereby, at least 182 kinds of PI interleave conversion rules are generated. However, in order to use PI interleave conversion rules which are different in all 208 rows, it is necessary to combine this method with another PI interleave conversion rule generating method. In addition, as long as a method can change M-series according to a row, the method besides the above-described examples can be used.

It is also possible to realize the PI interleave circuit 1517 and PI deinterleave circuit 1518, which are shown in FIG. 15, with another method without using the M-series generating circuit 1901.

Figure 18A:
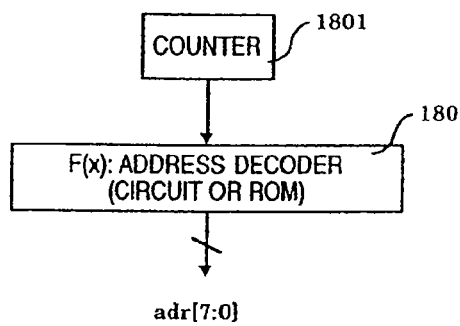
FIGS. 18A and 18B are block diagrams showing examples of constituting each address generating circuit by using an address decoder.
Figure 18B:
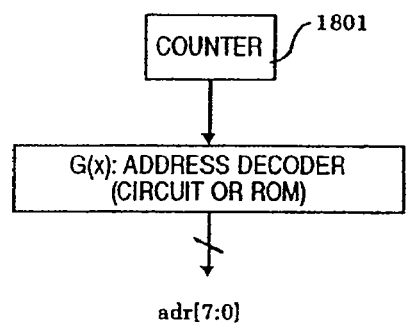

This is a method of realizing PI interleave conversion rules with ROM or a circuit as shown in FIGS. 18A and 18B instead of the M-series generating circuit 1901. In particular, this is effective when only several kinds of PI interleave conversion rules are necessary. Moreover, a still higher effect is expectable in that an address can be set freely such that PI interleave rules are managed with the distance between data adjacent to each other in an inner-code in order to advance random characteristics.

Moreover, there is a method of using arithmetic progression as a method except methods using M-series as PI interleave conversion rules.

Here, since what is necessary is just to use 182 arbitrary numbers as PI interleave rules in a DVD as PI interleave rules, suppose that numbers 0 to 181 are used.

This is a method of rearranging the list of an inner-code according to arithmetic progression, for example, rearranging positions of the data in the inner-code according to PI interleave rules that is, 0, 3, 6, 9, . . . , 177, 180, 1, 4, 7, . . . , 178, 181, 2, 5, 8, . . . , 176, 179 in the case of using a progression where numbers increases by 3.

In this case, it is necessary to use a constant, which is different in each row, as an increment. Nevertheless, when numbers that are coprime to 182 are used as constants, in regard to numbers exceeding 181, values obtained by subtracting 182 from the numbers can be used as the constants. However, when numbers that are not coprime to 182 are used as constants, for example, when the increment is 2, the numbers become 0, 2, 4, 8, . . . , 180, 0, 2, 4, . . . , and hence it becomes necessary to provide a system of adding one when exceeding 182 so that the same numbers may not appear twice.

Moreover, if most target burst errors generated at random are 10 bytes or less, it is better to choose 11 or more as an incremental constant.

However, when 182 bytes are selected as an inner-code when an arithmetic progression is used, it is necessary to note that the case where one is selected as a constant and the case that 181 is selected as a constant are the same in an object of dispersing errors in the different outer-codes.

This is because adjacent numbers become the same although there is difference between the left and the right since the list becomes 0, 1, 2, 3, 4, . . . , 181 when one is selected as a constant, and the list becomes 0, 181, 180, . . . , 4, 3, 2, 1 when 181 is selected.

Figure 24:
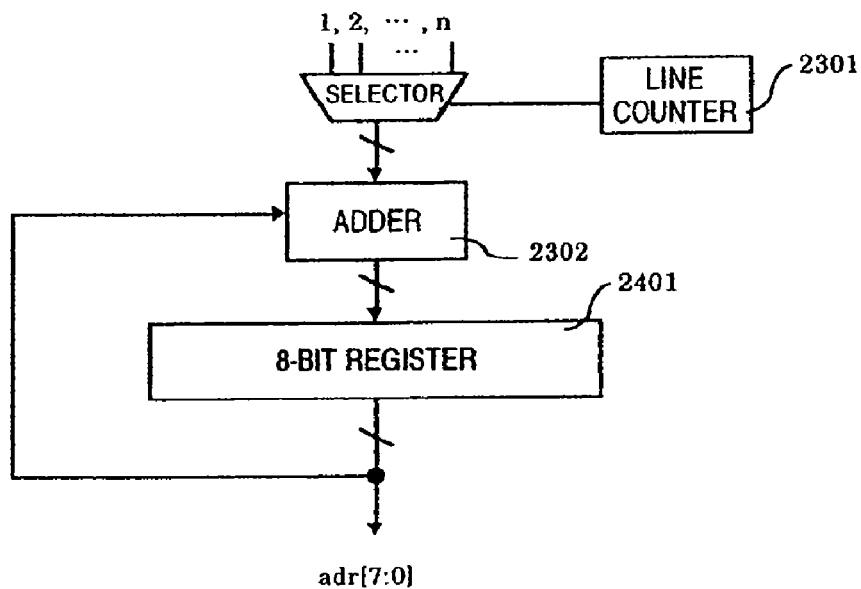
FIG. 24 is a block diagram showing an example of an arithmetic progression generating circuit.

An example (only numbers that are coprime to 182 except one are used) of the circuit that generates an arithmetic progression is shown in FIG. 24.

In this diagram, an incremental constant is selected and used by being switched according to the value of a row address changed and is used so that values outputted from an 8-bit register 2401 becomes an arithmetic progression and a different series as much as possible may be obtained according to an inner-code, that is, according to a row.

Figure 25:
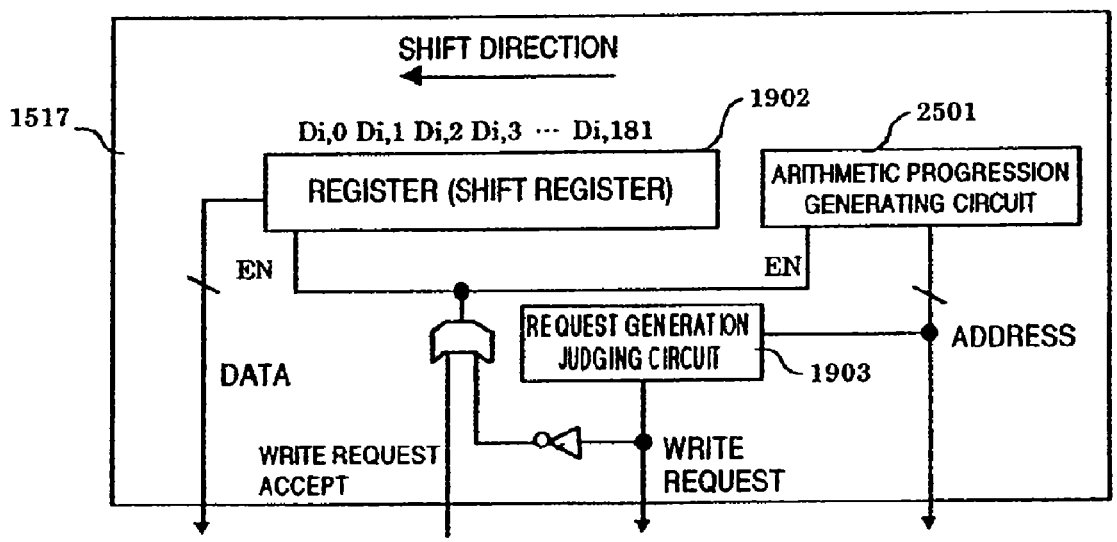
FIG. 25 is a block diagram showing an example of a PI interleave circuit.
Figure 26:
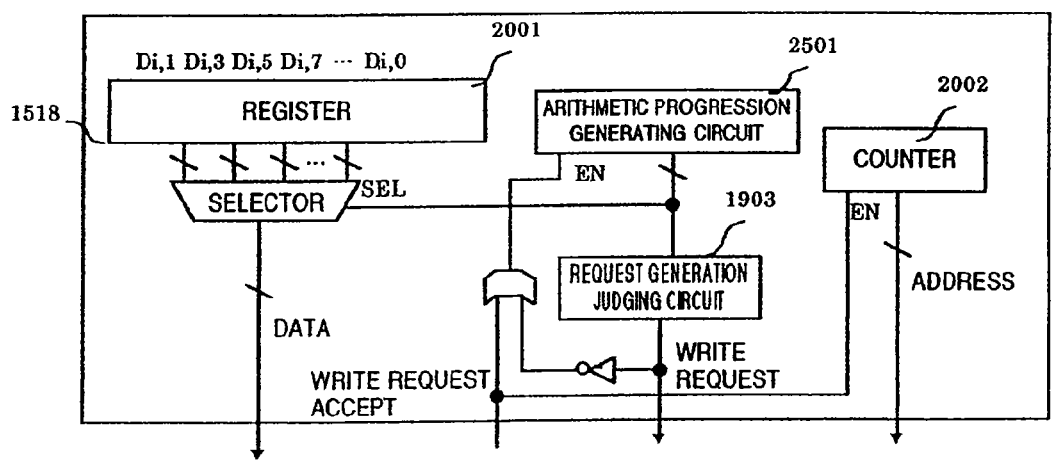
FIG. 26 is a block diagram showing an example of a PI de-interleave circuit (circuit which cancels PI interleave).

Moreover, FIGS. 25 and 26 show examples where arithmetic progressions are applied to the PI interleave circuit 1517 and PI deinterleave circuit 1518 in FIG. 15. This can be configured only by replacing the M-series generating circuit 1901 in FIGS. 19 and 20, which is described above, with the arithmetic progression generating circuit 2501 in FIG. 24.

The circuit in FIG. 19 is cited as an example of the M-series generating circuit 1901 of the PI interleave circuit 1517 in FIG. 15, and the method of arranging data in the addresses which corresponds to an M-series every one byte from a head of the data in an inner-code is shown. However, there is a method of arranging the data, stored at the positions on the inner-code generated by the M-series, in order of the M-series by using the PI deinterleave circuit 1518 in FIG. 20 as the PI interleave circuit 1517.

Moreover, FIG. 19 shows the PI deinterleave circuit 1518 corresponding to this.

Naturally, when a different M-series is used and this method is also used, the object to disperse burst errors on different outer-codes can be attained.

However, when this method is used, burst errors cannot be dispersed on different outer-codes by changing the initial value of an M-series in each row.

The relation between two kinds of these PI interleave methods are the same as the arithmetic progression generating circuits 2501 described by using FIG. 25 showing the PI interleave circuit 1517 and FIG. 26 showing the PI deinterleave circuit 1518.

PI interleave conversion rules can be configured by some combinations containing the M-series and arithmetic progression, which are introduced above, as well as one method, and the circuit which realizes them can be also realized by the combination of respective elements.

Moreover, it is also good to combine address decoders 1801 and 1802 constituted by the M-series generating circuit 1901, ROM, and circuits in order to generate many PI interleave conversion rules.

Figure 21:
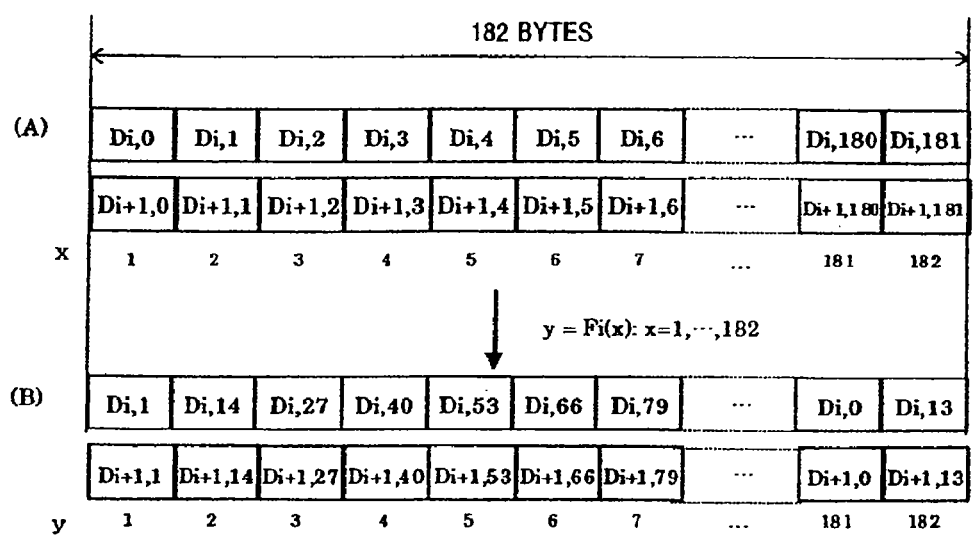
FIG. 21 is a block diagram showing an example of PI interleave being performed for two inner-codes under one PI interleave conversion rule.
Figure 22:
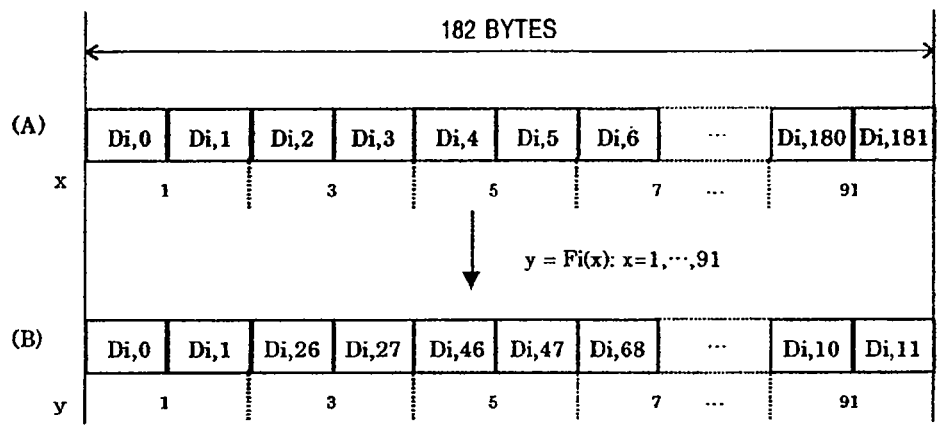
FIG. 22 is a block diagram showing an example of PI interleave being performed every two bytes to one inner-code.

Moreover, in order to take PI interleave conversion rules into consideration from a circuit and to perform transform processing at high speed, as shown in FIG. 21, it is possible to simultaneously perform a plurality of PI interleave by using the same conversion rule. It is also possible to simultaneously perform two or more bytes (2 bytes in FIG. 22) of PI interleave within the same inner-code, as shown in FIG. 22. That is, it is possible to make two or more bytes be a group, and to rearrange the order of groups by a group.

When these are actually implemented into circuits, the optimal PI interleave method can be selected in consideration of the bus width of RAM, and data allocation according to processing speed required. In addition, it is necessary to also take into consideration of the circuit scale at the time of implementation, and the degree of performance improvement obtained by the present invention.

Moreover, although these diagrams show examples at the time of performing PI interleave by 2 bytes unit, three or more are sufficient as the size of the inner-code to which the same PI interleave is actually applied.

Although cases where the present invention is applied to a DVD are described through embodiments, the present invention is effective at a digital data recording and reproducing apparatus, including a product code, and a digital data recording and reproducing method.

In addition, it should be noted that, when recording to a record media is performed according to the list of the outer-code in a product code, the inner-code used in the explanation corresponds to the outer-code. Moreover, although the signal processing circuit using an M-series and an arithmetic progression is exemplified in the PI interleave circuit 1517 and PI deinterleave circuit 1518, other pseudo-random number generating circuits or the like can be used.

What is claimed is:

1. A data recording method for recording data to a recording medium comprising the steps of:

forming a data block organized as data columns and data rows, each data row comprising a plurality of bytes, the data block including identification data indicative of positional information in the data block;

for each data column in the data block, adding bytes to include an error correcting code parity;

rearranging the order of bytes in each data rows according plural rearranging rules to produce a rearranged data block, including rearranging a first row of data according to a first rearranging rule and rearranging at least a second row of data according to a second rearranging rule different from the first rearranging rule;

for each data row in the rearranged data block, adding s SYNC code; and recording the rearranged data block to a recording medium.

2. A data reproducing method of reproducing data recorded on a recorded medium, comprising the steps of:

reproducing a data block on the recording medium; and performing an error correction process on the data block reproduced, wherein the recorded medium comprises a plurality of data blocks, each data block organized as data columns and data rows, each data column including an error code correcting parity, each data block including positional information in the data block, wherein for a first data row of each data block, bytes comprising the first data row are ordered in accordance with a first rearranging rule and a SYNC code is added to the first data row, wherein for a second data row of said each data block, bytes comprising the second data row are ordered in accordance with a second rearranging rule and a SYNC code is added to the second data row.

* * * * *